(12) United States Patent
Helgenberg et al.

(10) Patent No.: US 7,198,241 B1
(45) Date of Patent: Apr. 3, 2007

(54) SYSTEM AND METHOD FOR MOUNTING A COMPUTER COMPONENT

(75) Inventors: John A. Helgenberg, Paoli, PA (US); Kenneth J. Neeld, West Chester, PA (US)

(73) Assignee: Linsys Corporation, Blue Bell, PA (US)

( * ) Notice: Subject to any disclaimer, the term of this patent is extended or adjusted under 35 U.S.C. 154(b) by 0 days.

(21) Appl. No.: 10/727,763

(22) Filed: Dec. 3, 2003

(51) Int. Cl.
*A47F 5/00* (2006.01)
*A47B 88/00* (2006.01)

(52) U.S. Cl. ............................. 248/298.1; 248/346.07; 248/424; 312/334.5

(58) Field of Classification Search ....... 248/346.07, 248/424, 429, 298.1; 312/334.5, 334.8, 334.4, 312/334.46, 333; 361/685
See application file for complete search history.

(56) References Cited

U.S. PATENT DOCUMENTS

| | | | | |
|---|---|---|---|---|
| 2,774,542 A | * | 12/1956 | Anthony ..................... | 238/251 |
| 3,059,986 A | * | 10/1962 | Miller, Jr. ................. | 312/334.8 |
| 3,371,968 A | * | 3/1968 | Loake ......................... | 384/18 |
| 4,225,265 A | * | 9/1980 | Hooker et al. .............. | 403/353 |
| 4,560,212 A | * | 12/1985 | Papp et al. .................. | 384/18 |
| 5,262,923 A | * | 11/1993 | Batta et al. ................. | 361/685 |
| 5,722,750 A | * | 3/1998 | Chu ....................... | 312/334.11 |
| 5,833,337 A | * | 11/1998 | Kofstad .................. | 312/334.5 |
| 5,842,383 A | * | 12/1998 | Yamada et al. .............. | 74/528 |
| 5,921,643 A | | 7/1999 | Louth | |
| 6,070,957 A | * | 6/2000 | Zachrai ................... | 312/334.4 |
| 6,126,255 A | * | 10/2000 | Yang ...................... | 312/334.46 |
| 6,230,903 B1 | * | 5/2001 | Abbott ....................... | 211/26 |
| 6,375,290 B1 | * | 4/2002 | Lin et al. ................ | 312/334.46 |
| 6,585,335 B2 | * | 7/2003 | Hwang et al. ............. | 312/333 |

* cited by examiner

*Primary Examiner*—Anita M. King
(74) *Attorney, Agent, or Firm*—Mark T Starr; Richard J. Gregson; Joshua L. Cohen

(57) ABSTRACT

A system is provided for mounting a computer component. The system has at least one rail with first and second mounting portions. The first mounting portion defines a recess. The second mounting portion has at least one detent. The system also has first and second supports. The first support has an extension extending into the recess and allows sliding of the first mounting portion relative to the first support. The second support defines at least one aperture that receives the detent and limits sliding of the second mounting portion relative to the second support.

15 Claims, 7 Drawing Sheets

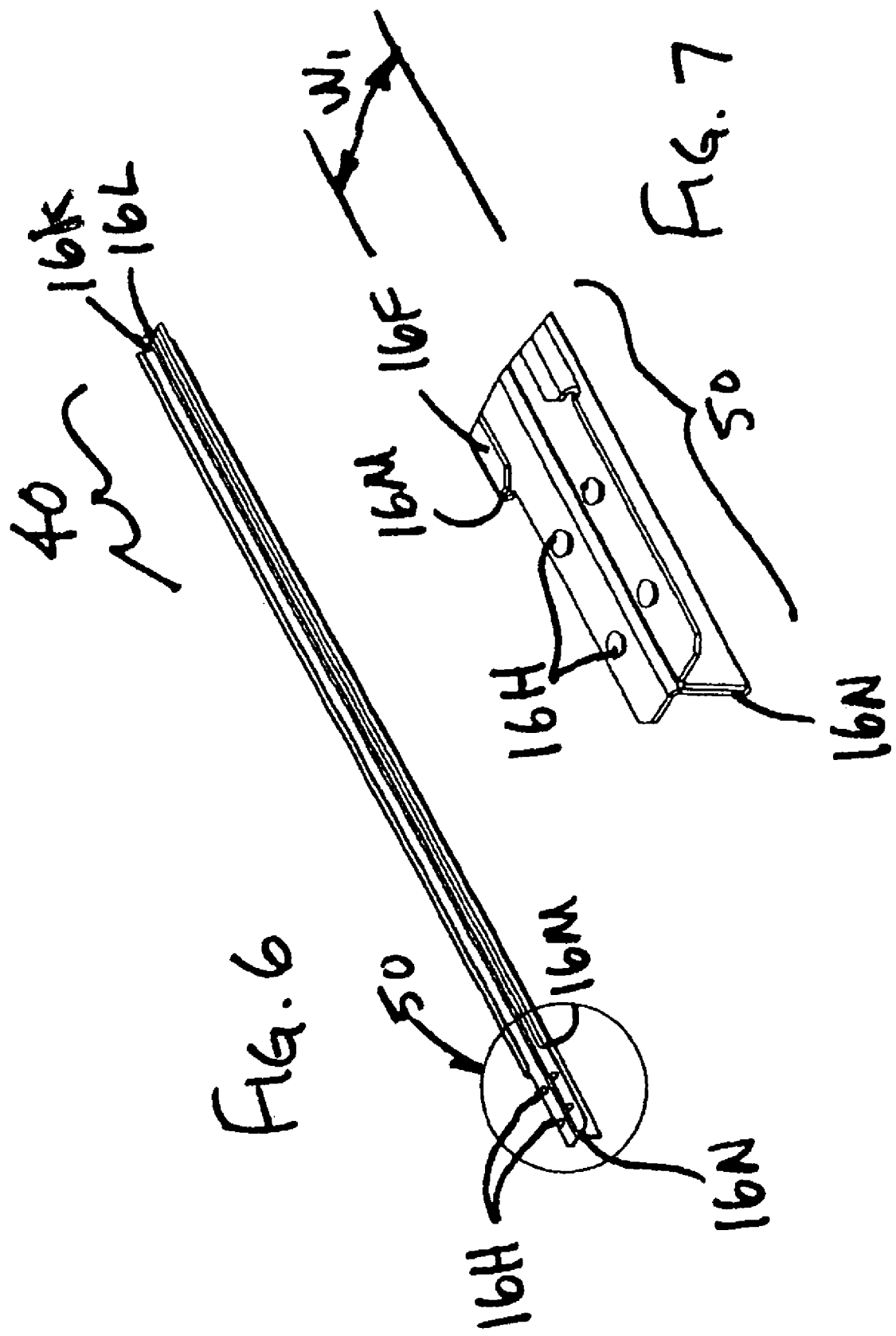

US 7,198,241 B1

SYSTEM AND METHOD FOR MOUNTING A COMPUTER COMPONENT

FIELD OF THE INVENTION

The present invention relates generally to support systems for computer components. More particularly, it relates to a support system on which a computer component may be mounted without requiring any tools.

BACKGROUND OF THE INVENTION

Support systems are sometimes needed for large computers and computer systems. When a heavy computer system or component must be supported, multiple supports are often used. Typically, supports are assembled with the use of screws which have to be manually manipulated. The use of screws also requires the use of a tool to complete the installation. In addition, the physical size of the screws and where they would have to be placed might interfere with the mounting of the computer system.

Accordingly, there remains a need for an improved system and method for mounting a computer system or a component thereof with the reduced need for fasteners and tools.

SUMMARY OF THE INVENTION

According to one aspect, this invention provides a system for mounting a computer component. The system uses at least one rail which has a first mounting portion and a second mounting portion. The first mounting portion defines a recess. The second mounting portion has at least one detent. The system also has first and second supports. The first support has an extension that extends into the recess of the first mounting portion of the rail. The first support allows sliding of the first mounting portion of the rail relative to the first support. The second support defines at least one aperture that receives the detent of the second mounting portion of the rail. The second mounting portion also limits sliding of the second mounting portion of the rail relative to the second support.

According to another aspect, this invention provides a support assembly for a computer component. The support assembly has a rail a support adjacent the rail. The support assembly also has a detent extending from the rail or from the support. The detent is engaged with an aperture defined in the other of the rail or the support. The support assembly also has an extension coupled to the support. The extension has a portion that is moveable between a first position and a second position with respect to the support. When the extension is in the first position, it prevents sliding of the rail with respect to the support. When the extension is in the second position, it permits sliding of the rail with respect to the support.

According to yet another aspect, this invention also involves a method of mounting a rail in a frame of a computer system. The rail is positioned adjacent to first and second supports. A recess in a first mounting portion of the rail engages an extension on the first support. This engaging step permits sliding movement of the rail with respect to the first support. A detent on a second mounting portion of the rail engages an aperture formed in the second support. This engaging step limits sliding movement of the rail with respect to the second support.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following features:

FIG. 6 is a bottom perspective view of the rail illustrated in FIG. 5;

FIG. 7 is a bottom perspective view of a second mounting portion of the rail illustrated in FIG. 5;

DETAILED DESCRIPTION OF THE INVENTION

Figure 1:
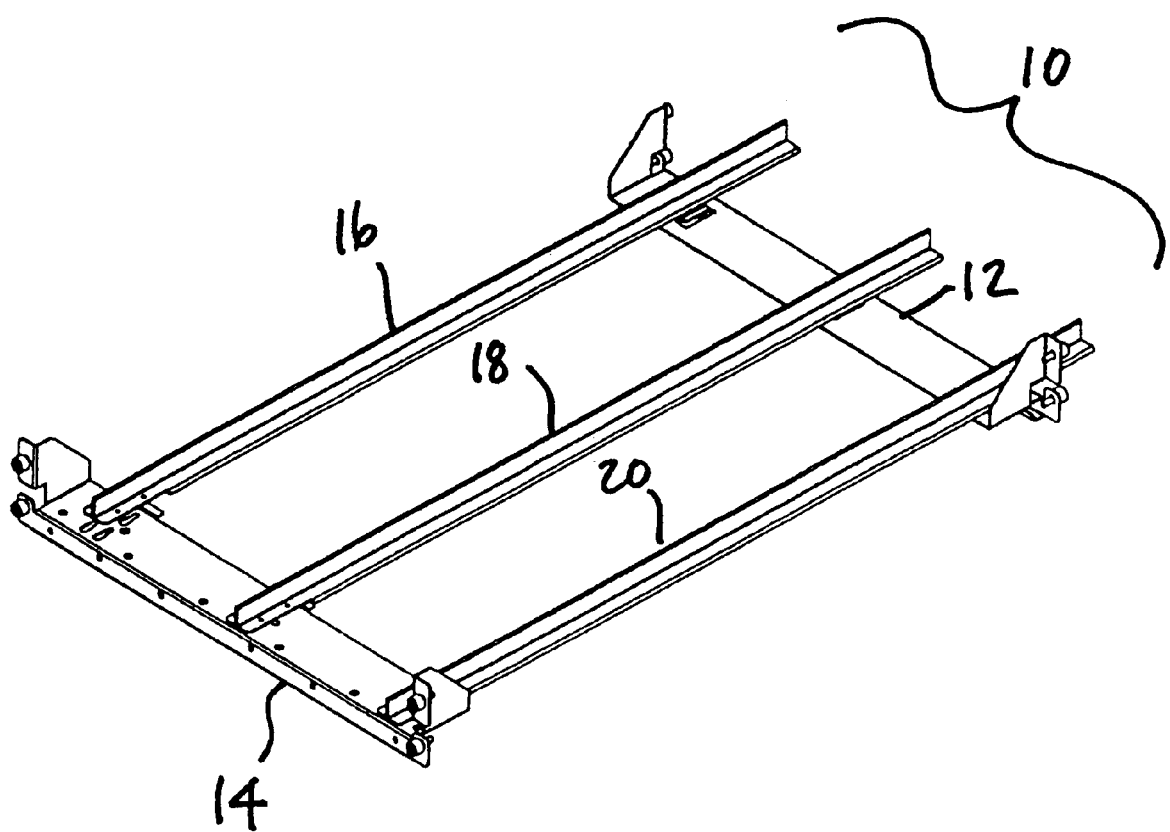
FIG. 1 is a perspective view of the rails and supports that comprise the system according to one exemplary embodiment of the present invention.

Various aspects of the invention will now be described with reference to the Figures. It will be appreciated that this invention is not limited in spirit or scope to the embodiments selected for illustration in the Figures. It will also be appreciated that the embodiments shown in the Figures are not rendered to any particular scale or proportion.

Referring generally to the Figures, in which like reference numbers refer to like elements throughout, a system 10 is provided for mounting a computer component (not shown). The system 10 uses at least one rail 16 which has a first mounting portion 40 and a second mounting portion 50. The first mounting portion defines a recess 16G. The second mounting portion has a least one detent 16H. The system also has first and second supports 12, 14. The first support 12 has an extension 32A that extends into the recess 16G of the first mounting portion 40 of the rail 16. The first support 12 allows sliding of the first mounting portion 40 of the rail relative to the first support 12. The second support 14 defines at least one aperture 72 that receives the detent 16H of the second mounting portion 50 of the rail 16. The second mounting portion 50 also limits sliding of the second mounting portion 50 of the rail relative to the second support 14.

The Figures also show a support assembly 10 having a rail 16 that defines at least one recess 16G which extends along a surface 16G of the rail. At least one detent 16H is formed on the surface of the rail. The support assembly 10 also has a support 12, 14 coupled to the rail. This support 12, 14 has at least one aperture 72 that receives the detent of the rail. The support 12, 14 also has at least one extension 32A or 32B that extends into the recess 16G of the rail. The support assembly also has an extension 74 coupled to the support. The extension has a portion that is moveable between a first position and a second position with respect to the support. When the extension is in the first position, it prevents sliding of the rail 16 with respect to the support 12, 14. When the extension is in the second position, it permits sliding of the rail with respect to the support.

In use, the rail 16 is positioned adjacent to first and second supports 12, 14. A recess 16G in a first mounting portion 40 of the rail engages an extension 32A or 32B on the first support 12. This engaging step permits sliding movement of the rail with respect to the first support. A detent 16H on the second mounting portion 50 of the rail engages an aperture 72 in the second support 14. This engaging step limits sliding movement of the rail with respect to the second support.

FIG. 1 shows a perspective view of an exemplary embodiment of the system 10 according to the present invention. As shown in FIG. 1, the system 10 has a first saddle or first support 12 and a second saddle or second support 14. The system 10 also has a plurality of rails that are mounted onto the first support 12 and the second support 14. In an exemplary embodiment, the system may have three rails 16, 18, and 20. Although FIG. 1 shows 3 rails, more rails or fewer rails may be used in other embodiments. Each of the rails 16, 18, and 20 may be mounted onto the first support 12 in a manner to be described below. Each of the rails 16, 18, and 20 may also be mounted on the second support 14 in a manner which will also be described below.

The rails 16, 18, and 20 are substantially parallel to each other and are substantially orthogonal to the first support 12 and substantially orthogonal to the second support 14. A chassis enclosing a computer system or computer system component may be placed onto the rails and slid into place. To do so, the chassis may be placed adjacent the ends of the rails at second support 14 and slid onto the rails toward first support 12 until the rails support the full depth of the chassis.

Figure 2:
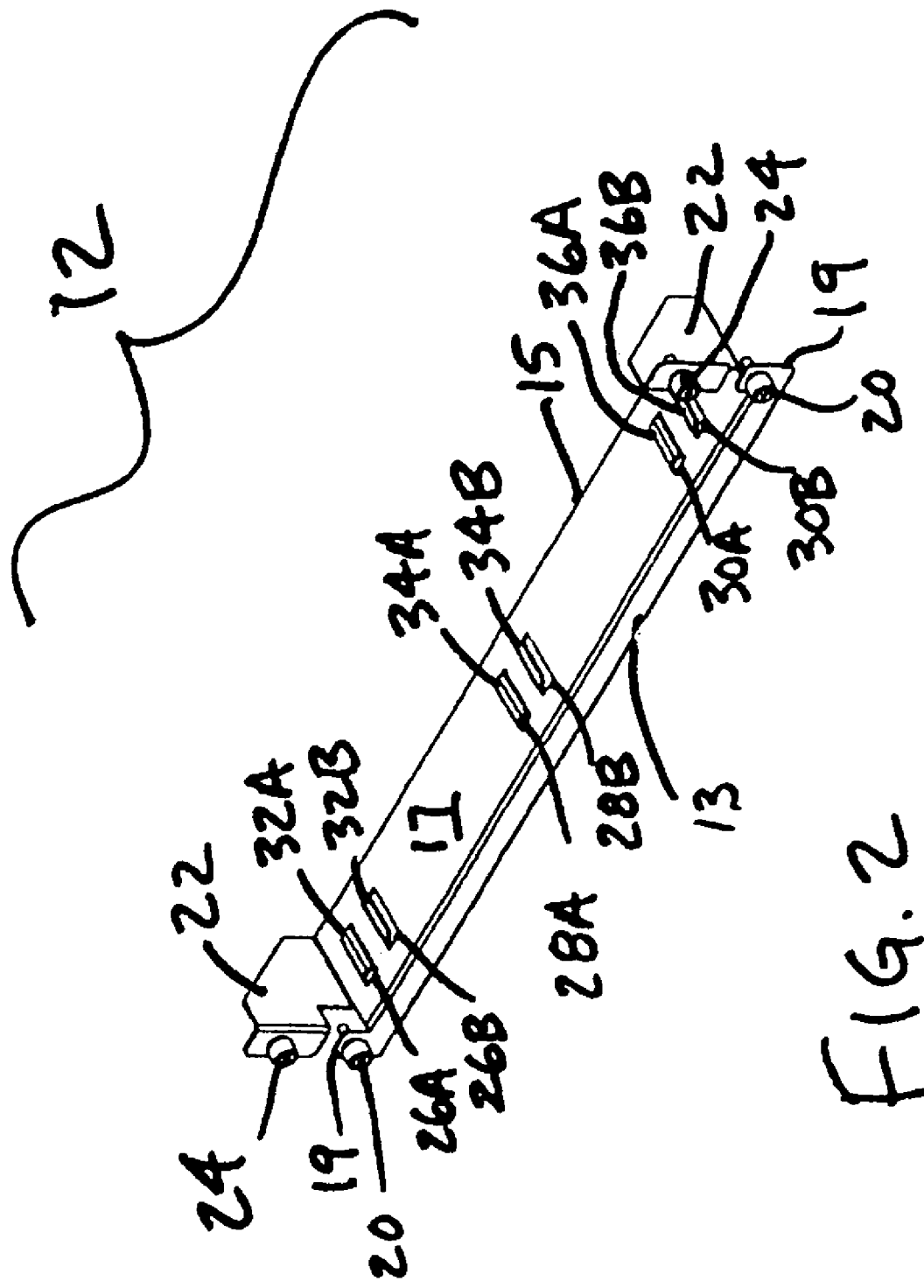
FIG. 2 is a perspective view of a first support of the system illustrated in FIG. 1.

FIG. 2 is a perspective view of the first support 12 that is shown in FIG. 1. The first support 12 has a horizontal portion 15 and a vertical portion 16. Each end of the vertical portion 16 has a first flange 19. Each of the flanges 19 has a screw 20 inserted into it. Each end of the horizontal portion 15 has a second flange 22. Inserted into each of the flanges 22 is a screw 24. Flanges 19, 22 and screws 20, 24 are used to mount the first support 12 to a frame (not shown), such as a standard 19" rack frame typically used to house computer systems.

Along horizontal portion 15 of first support 12 there are three sets of apertures. The sets of apertures are all located such that they extend through the top surface 17 of the horizontal portion 15. Each set of apertures has a first aperture and a second aperture. The first set of apertures has a first aperture 26A and a second aperture 26B which are located near one end of horizontal portion 15. The second set of apertures may be located approximately in the middle of the horizontal portion 15 and includes a first aperture 28A and a second aperture 28B. The third set of apertures may be located near the other end of the horizontal portion 15 and includes a first aperture 30A and a second aperture 30B. In other embodiments, there may be more or fewer numbers of apertures sets. The number of aperture sets are equal to the number of rails mounted onto first and second supports 12, 14.

An extension protrudes adjacent each of the apertures. First extension 32A protrudes adjacent first aperture 26A and second extension 32B protrudes adjacent second aperture 26B. Similarly, first extension 34A protrudes adjacent first aperture 28A, second extension 34B protrudes adjacent second aperture 28B, first extension 36A protrudes adjacent first aperture 30A and second extension 36B protrudes adjacent aperture 30B. Since other embodiments may have more or fewer apertures then what is shown in FIG. 1, the number of extensions may be more or less than the number of extensions shown in FIG. 1. Additional details about the apertures and extensions are provided below with reference to FIG. 3.

Extensions 32A, 32B and top surface 17 together define spaces into which portions of rail 16 extend. Similarly, extensions 34A, 34B and top surface 17 together define spaces into which portions of rail 18 extend. The support 12 may be formed from sheet metal. The extensions may also be formed from the sheet metal by punching the sheet metal and bending the punched portion, thereby forming the spaces and extensions. In alternative embodiments, the extensions may be formed in other manners. For example, the extension may be formed separately and then by attaching them to top surface 17 or to the bottom surface of first support 12 (not shown).

Figure 3:
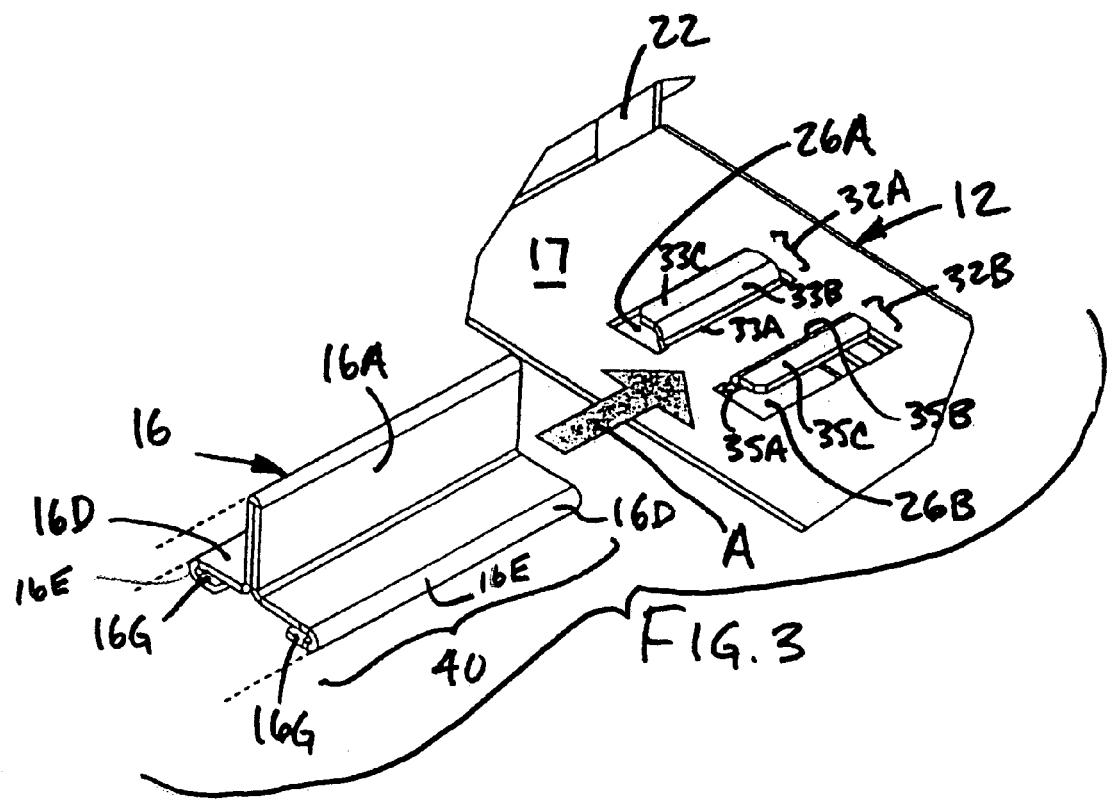
FIG. 3 is an exploded perspective view of a rail and a first support of the system illustrated in FIG. 1.

Referring now to FIG. 3, there is shown an exploded perspective view of first support 12 and first rail 16 and the relationship of first rail 16 to top surface 17 of first support 12. Although FIG. 3 shows aperture set 26A and 26B and extensions 32A and 32B in combination with rail 16, the description and relationship of those elements also pertains to the relationship between any other rail and any other aperture set which may be used with system 10. For example, the description applies to second rail 18 in combination with aperture set 28A, 28B, first extension 34A, and second extension 34B.

FIG. 3 shows first extension 32A extending adjacent first aperture 26A and second extension 32B extending adjacent second aperture 26B. Both first extension 32A and second extension 32B each comprise three portions made from a single sheet of metal. First extension 32A includes a first portion 33A, a second portion 33B, and third portion 33C. Second extension 32B includes a first portion 35A, a second portion 35B, and a third portion 35C. First portion 33A is attached to or integral with the horizontal portion 15 of first support 12.

First portion 33A of first extension 32A extends from the horizontal portion 15 of first support 12 in an upward direction. Second portion 33B extends from first portion 33A and curves around in a direction that is toward flange 22. Third portion 33C extends from second portion 33B parallel to top surface 17 of first support 12 and toward flange 22. Third portion 33C extends across first aperture 26A substantially parallel to top surface 17. The longitudinal axis of first extension 32A is substantially parallel to the longitudinal axis of rail 16. A recess is defined between third portion 33C of first extension 32A and top surface 17 of first support 12.

Second aperture 26B has a second extension 32B which is similar to first extension 32A. Second extension 32B has three portions which are similar to the three portions of first extension 32A. The first portion 35A is attached to or integral with the horizontal portion 15 of first support 12. First portion 35A extends upwards from the horizontal portion 15 of first support 12 and extends into second aperture 26B. Second portion 35B (not shown) extends from portion 35A and curves around in a direction that is away from flange 22. Third portion 35C extends from second portion 35B parallel to top surface 17 of first support 12 and in a direction that is away from flange 22. Third portion 35C extends substantially parallel to top surface 17 of first support 12. The longitudinal axis of second extension 32B is substantially parallel to the longitudinal axis of the rail 16. A recess is defined between third portion 35C and top surface 17 of first support 12.

Each of the other apertures on first support 12 also have a first extension and a second extension which are substantially the same as first extension 32A and second extension 32B. In other embodiments, where additional rails may be used, there may also be additional apertures and extensions which may be substantially the same as the apertures and extensions described above.

Referring again to FIG. 3, there is shown a first mounting portion 40 of rail 16. Rail 16 includes a vertical branch 16A and two horizontal branches 16D which are substantially perpendicular to vertical branch 16A. Horizontal branches 16D of rail 16 have rounded shoulders 16E. Each of the horizontal branches forms respective recesses 16G having inward extensions which are parallel to horizontal branches 16D. The nature of the inward extensions and the recesses are shown in greater detail in FIG. 5.

Figure 5:
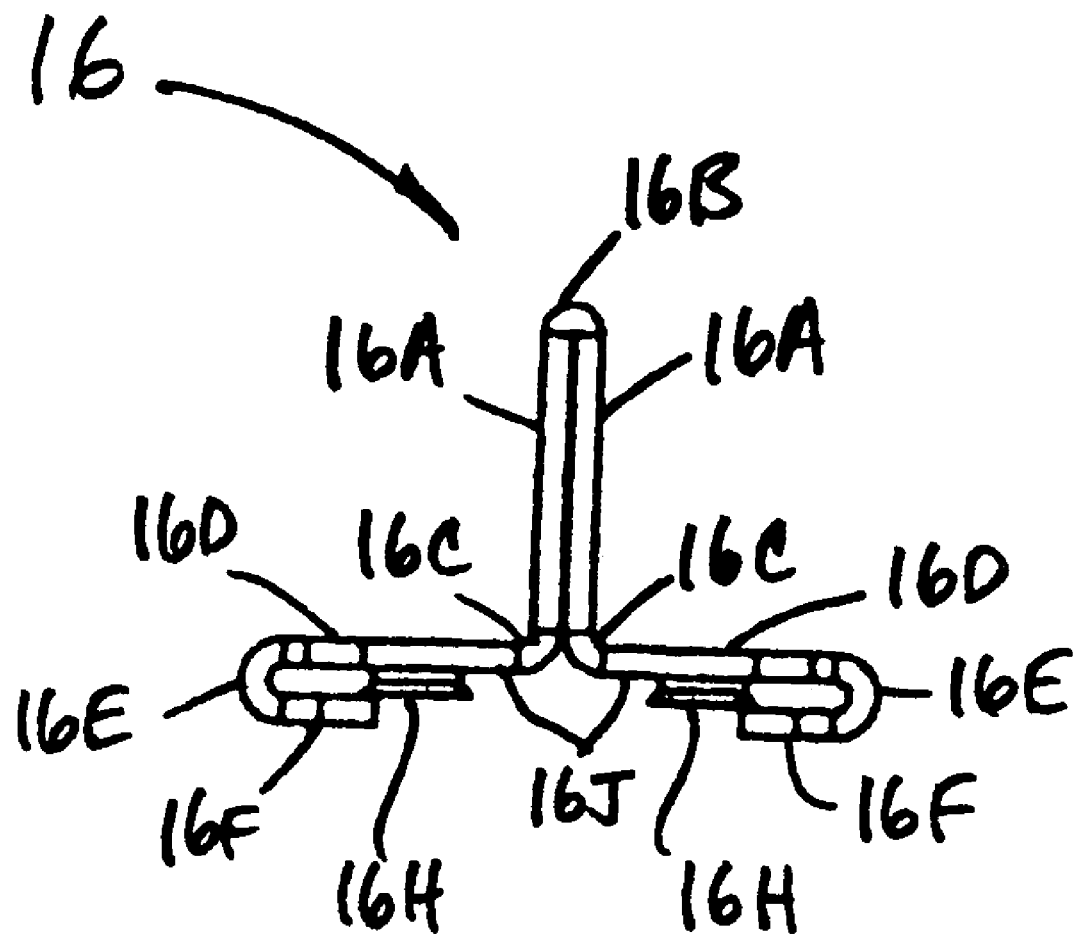
FIG. 5 is an end view of one of the rails of the system illustrated in FIG. 1.

FIG. 5 is an end view of rail 16, including first mounting portion 40 and second mounting position 50. FIG. 5 shows that vertical branch 16A of rail 16 is formed from two legs connected by a bend 16B at their top. Each of the legs forms a rounded bend 16C at their bottom. The rail then forms the two horizontal branches 16D which are substantially perpendicular to the vertical branch 16A. The other ends of each of the horizontal branches 16D form rounded shoulders 16E. Rounded shoulders 16E curve from the top surface of the horizontal branches to a location which is underneath the bottom surface 16J of each of the horizontal branches 16D. Inward extensions 16F extend underneath bottom surface 16J inwardly from each of the rounded shoulders 16E toward the respective vertical branches 16A thereby forming two recesses 16G between the inward extensions 16F and the horizontal branches 16D.

Rail 16 may be formed by bending a sheet of metal, such as aluminum or other metal, at 16B, 16C, and 16E. Other methods of forming rail 16 or bends 16B, 16C and rounded shoulder 16E are contemplated as well. For example, one or more of the bends and the rounded shoulder may be manufactured separately and attached to the vertical and horizontal branches.

Referring back to FIG. 3, a method of mounting rail 16 to first support 12 will now be described. FIG. 3 shows a first mounting portion 40 of rail 16. Rail 16 is positioned adjacent to first support 12 so that recesses 16G in rail 16 receive, respectively, first extension 32A and second extension 32B of first support 12. Rail 16 may then be moved relative to first support 12 in a direction indicated by arrow A. As the rail is moved toward, and onto, first support 12 in the direction indicated by arrow A, recesses 16G of first mounting portion 40 respectively engage first extension 32A and second extension 32B. As recesses 16G engage first and second extensions 32A and 32B, sliding movement of the rail with respect to first support 12 is permitted. As rail 16 slides along first support 12 and its recesses 16G engage first and second extensions 32A and 32B, rail 16 moves from a first position to a second position with respect to first support 12. After recesses 16G of rail 16 have fully engaged first and second extensions 32A and 32B, rail 16 is prevented from moving in a lateral direction that is parallel to the longitudinal axis of first support 12 or from moving in a vertical direction that is perpendicular to the top surface 17 of the first support 12.

Figure 4:
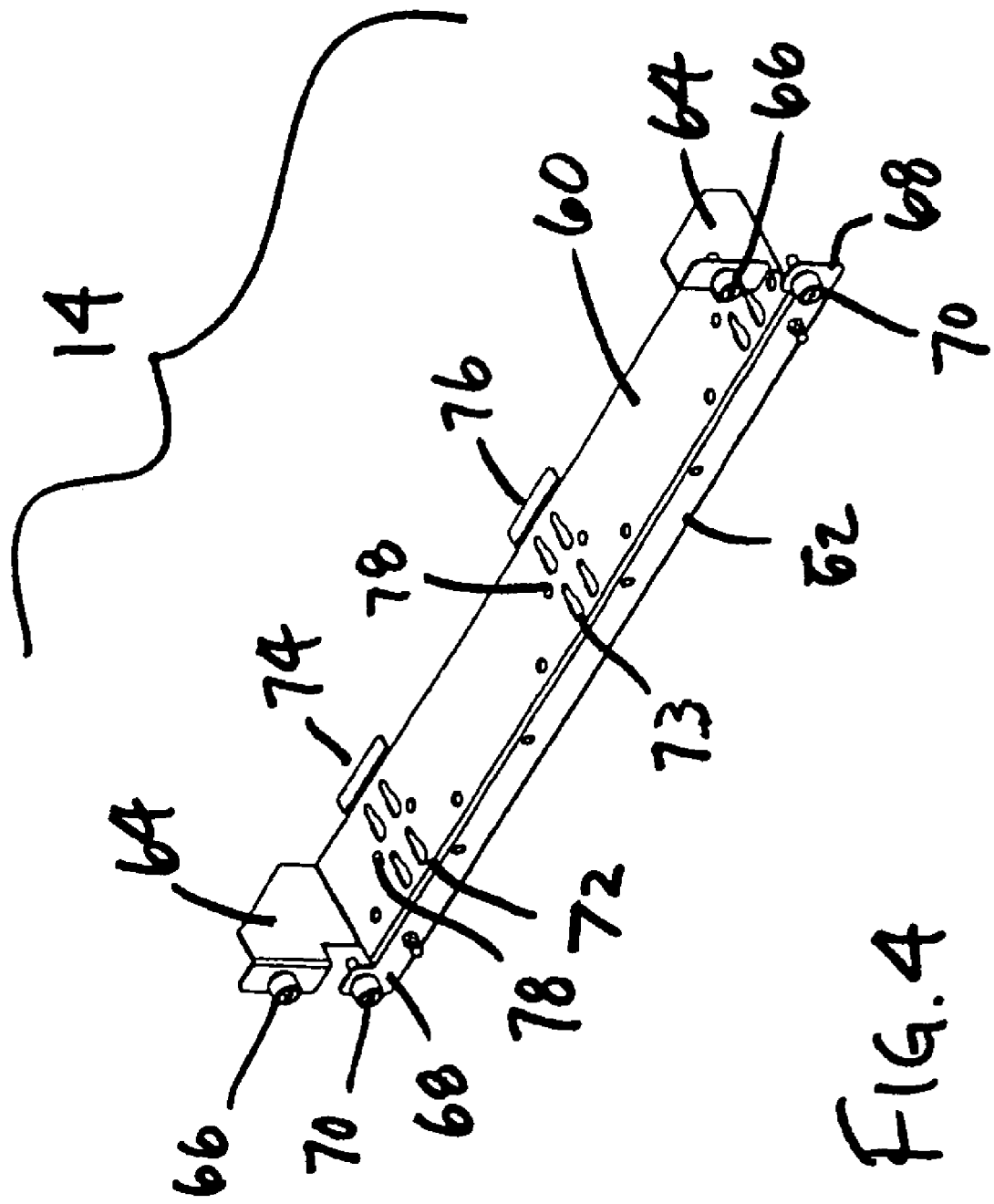
FIG. 4 is a perspective view of a second support of the system illustrated in FIG. 1.

FIG. 4 is a perspective view of a second support 14 of the system shown in FIG. 1. Second support 14 has a horizontal portion 60 and a vertical portion 62. Flanges 64, located at opposite ends of horizontal portion 60, are coupled to the horizontal portion 60. Screws 66 are inserted into flanges 64 for mounting to a frame or rack. Vertical portion 62 forms two flanges 68 at each end thereof. A screw 70 is inserted into each of the flanges. Flanges 64, 68 and screws 66 and 70 enable the second support 14 to be mounted to a rack or frame.

There are a number of generally elliptically shaped apertures 72 located within horizontal portion 60. An extension 74 is coupled to the under surface (not shown) of horizontal portion 60. Extension 74 is connected to horizontal portion 60 at locations 78 by fasteners, spot welds, or other known techniques.

A second set of apertures 73 may be located approximately midway along the longitudinal axis of horizontal portion 60. A second extension 76 may be located adjacent to apertures 73. Second extension 76 is coupled to horizontal portion 60 in substantially the same way as extension 74 is coupled to horizontal position 60. The combination of apertures 72 and extension 74 may be used to mount rail 16 onto horizontal portion 60 at a second mounting portion 50 of rail 16. The combination of second extension 76 and apertures 73 may be used to mount second rail 18 (shown in FIG. 1) at a second mounting portion of second rail 18. Additional extensions and apertures may be used with horizontal portion 60 for additional rails which may be used. Additional details of the apertures and the extensions are described below.

FIG. 6 is a bottom perspective view of rail 16 shown in FIGS. 1 and 3. FIG. 6 shows first mounting portion 40 and second mounting portion 50. FIG. 7 shows second mounting portion 50 in greater detail. Referring to FIGS. 6 and 7, the part of first mounting portion 40 shown in FIG. 6 shows that the end 16L of the recess 16G and the end 16J of the bottom surface of the rail 16 extend to the end 16K of the vertical portion 16A of the rail. At second mounting portion 50 of rail 16, the recess ends at 16M which is a location which comes before end 16N of rail 16. The second mounting portion 50 includes a plurality of detents 16H mounted on bottom surface 16J of rail 16. Referring to FIG. 5, it is seen that when rail 16 is in a vertical position, detents 16H protrude downward from the bottom surface of horizontal portion branches 16D. While other fasteners are contemplated, detents can be formed by clinch nuts such as those disclosed in U.S. Pat. No. 5,921,643 to Louth, incorporated herein by reference.

Figure 8:
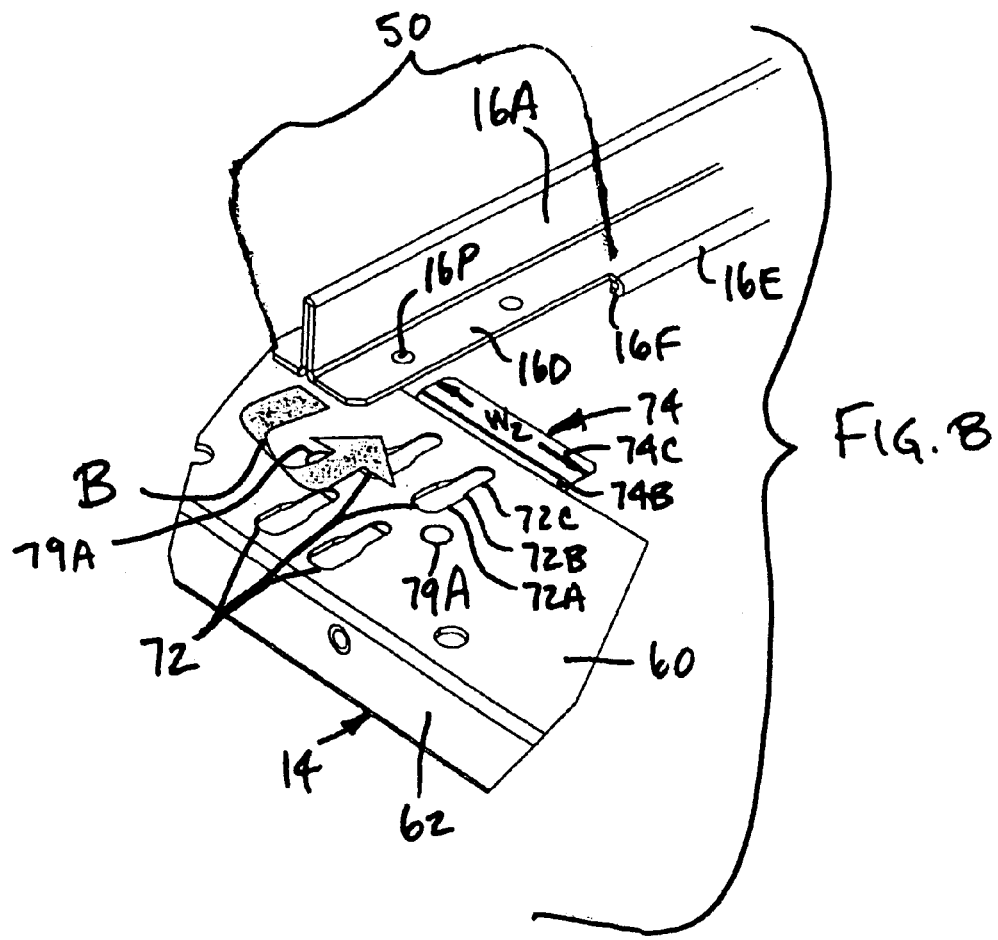
FIG. 8 is an exploded perspective view of a second mounting portion of a rail and its interconnection with the second support of the system illustrated in FIG. 1.

FIG. 8 is an exploded perspective view of the second mounting portion 50 of rail 16. It also shows the interconnection between rail 16 and second support 14. Apertures 72 are formed within horizontal portion 60 of second support 14. Each aperture 72 has three portions. A first portion 72A is sized to receive a detent 16H along a longitudinal axis of the detent. The second portion 72C is narrower than first portion 72A. Second portion 72C is sized to receive detent 16H and is also sized to prevent removal of the detent along the axis of the detent. More specifically, detent 16H has a contoured surface with an outer diameter larger at its end and a taper (see FIG. 5). Second portion 72C is sized to prevent removal of the detent 16H. Second portion 72C is also tapered to provide a snug fit between detent 16H and second support 14. Between first portion 72A and second portion 72C is a connecting channel 72B. The connecting channel is sized to guide the detent to slide from first portion 72A into second portion 72C. Connecting channel 72B is wider at a location near first portion 72A than it is at a location near second portion 72C.

Referring to FIG. 8, detents (not shown) are coupled to the under surface of horizontal portion 16D. FIG. 8 shows the mounting portions 16P of each detent. Mounting portion 16P is shown on the top surface of horizontal portion 16D of rail 16.

FIG. 8 also shows extension 74 and its relationship to apertures 72. The longitudinal axis of a movable portion of extension 74 is substantially parallel to the longitudinal axis of second support 14 and orthogonal to the longitudinal axis of rail 16. Extension 74 is also substantially parallel to both horizontal portions 16D of rail 16 across the width of horizontal portions 16D.

Referring back to FIG. 7, the distance between the rounded shoulders 16E of rail 16 is $W_1$. Referring again to FIG. 8, the distance between the longitudinal edges of extension 74 is $W_2$. The width $W_2$ is greater than the width $W_1$. Recess 16G is oriented along a plane which is substantially parallel to the bottom surface 16J of rail 16. Extension 74 may be positioned in the plane of the recess. When it is so positioned, the extension 74 prevents movement of rail 16 in the direction of the longitudinal axis of rail 16 and transverse to the longitudinal axis of second support 14.

Figure 9:
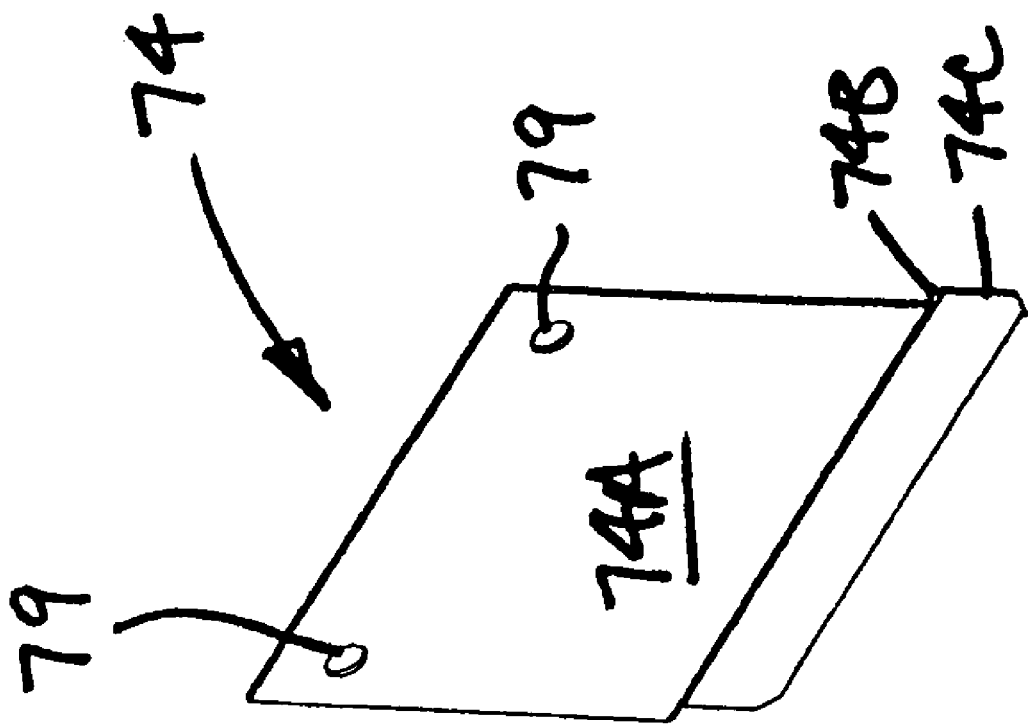
FIG. 9 is a perspective view of an extension of a second support of the system illustrated in FIG. 1.

FIG. 9 is a perspective view of extension 74. It is a plate having three portions. Mounting portion 74A is mounted on the bottom surface (not shown) of horizontal portion 60 of second support 14 at mounting holes 79. A second portion, a connecting member, 74B is formed adjacent to portion 74A. Second portion 74B extends upward from first moveable portion 74A. Referring to FIG. 8, second portion 74B extends above the plane of second support 14.

Referring back to FIG. 9, third portion 74C is formed adjacent portion 74B. FIG. 8 shows that third portion 74C extends substantially parallel to the longitudinal axis of horizontal portion 60 of second support 14 and away from second support 14. Third portion 74C also extends toward recess 16G. After extension 74 is attached to the bottom surface of second support 14, third portion 74C has a first position that is in the plane of recess 16G and above the horizontal plane formed by horizontal portion 60 of second support 14. Third portion 74C of extension 74 has a second position that is beneath the plane of recess 16G and beneath the horizontal plane formed by horizontal portion 60 so that the inward sections 16F of the rail (defining each recess 16G) may slide over extension 74.

A method of mounting rail 16 at its second mounting portion 50 will now be described with respect to FIG. 8. Second mounting portion 50 of rail 16 is positioned adjacent to second support 14 such that vertical branch 16A is pointing in an upward direction and detents 16H are facing in a downward direction toward apertures 72. Detents 16H are engaged in respective apertures 72 thereby preventing lateral motion of the second mounting portion 50 of rail 16 along the longitudinal axis of second support 14. After detents 16H are engaged in the first portions 72A of detents 72, the rail is caused to slide in the direction of arrow B so that the detents engage second portions 72C of apertures 72 after passing through the connecting channels 72B. Thus, the rail slides between a first position when the detents are in first portions 72A to a second position when the detents are in second portions 72C. Once the rail slides into portions 72C and 72B, the rail is prevented from moving perpendicularly relative to second support 14. When the rail is first positioned onto second support 14, inward sections 16F of rail 16 push down on extension 74 so that extension 74 moves from the first position to the second position underneath recess 16G.

As rail 16 slides relative to second support 14 in the direction of arrow B, inward sections 16F slide off of extension 74 thereby allowing extension 74 to return (by spring bias) to its first position above the horizontal plane formed by horizontal portion 60 of second support 14. When extension 74 is in the first position, it prevents sliding of the rail in a direction that is opposite to arrow B with respect to support 14. When it is desired to remove the rail from second support 14, extension 74 may be moved to its second position (e.g., manually), thereby permitting sliding of the rail relative to the support in the direction that is opposite to arrow B.

The operation of the invention will now be described with reference to all of the figures. A rail 16 is placed on top of second support 14 so that the end of the rail 16K and the end of the recess 16L are between first support 12 and second support 14. As the rail is slid toward first support 12, inward extensions 16F slide on top of extension 74 thereby pressing it downward, recesses 16G approach first extension 32A and second extension 32B, and detents 16H approach apertures 72. After the rail reaches first support 12, further sliding of the rail causes the end of rail 16K and the end of recess 16L to approach first and second extensions 32A, 32B and then to mate with first and second extensions 32A, 32B. That is, first and second extensions 32A, 32B slide inside recesses 16G.

At the same time that the rail slides toward first support 12, detents 16H approach second support 14 and apertures 72 in horizontal portion 60. As the rail continues to slide, inward extensions 16F of the rail slide off of extension 74, thereby allowing extension 74 to raise up to its first position at least partially traversing the plane of recesses 16G. Detents 16H also slide into first portion 72A of apertures 72 and into second portion 72C through connecting channel 72B of apertures 72.

After the first and second mounting portions 40, 50 have been coupled to first and second supports 12, 14, first and second extensions 32A, 32B prevent upward movement and sideward movement of the end of the rail coupled to them, but allow sliding of the rail transversely to the supports. Detents 16H and apertures 72 prevent upward movement and sideward movement of the end of the rail coupled to second support 14. Extension 74 limits movement of the rail transversely to the supports.

The system may be used in connection with a variety frames and frame depths. For example, a frame that is not as deep as the length of the rails can employ the system disclosed herein because the first support 12 may simply be moved closer to second support 14 for connection to the frame by sliding first support 12 along the rail(s) 16. This flexibility in the system provides the benefit that a single assembly can accommodate various rack depths.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A system for mounting a computer component, said system comprising:

at least one rail, said rail having first and second mounting portions, said first mounting portion defining a recess and said second mounting portion having at least one detent; and first and second supports, said first support having an extension extending into said recess of said first mounting portion of said rail and allowing sliding of said first mounting portion of said rail relative to said first support, said second support defining at least one aperture receiving said detent of said second mounting portion of said rail and limiting sliding of said second mounting portion of said rail relative to said second support, wherein the recess is substantially parallel to the rail and a longitudinal axis of the rail is substantially orthogonal to a longitudinal axis of the first support, so that the longitudinal axis of the rail slides substantially orthogonally to the longitudinal axis of the first support.

2. The system of claim 1, wherein the second mounting portion has a plurality of detents.

3. A system for mounting a computer component, said system comprising:
   at least one rail, said rail having first and second mounting portions, said first mounting portion defining a recess and said second mounting portion having at least one detent; and
   first and second supports, said first support having an extension extending into said recess of said first mounting portion of said rail and allowing sliding of said first mounting portion of said rail relative to said first support, said second support defining at least one aperture receiving said detent of said second mounting portion of said rail and limiting sliding of said second mounting portion of said rail relative to said second support,
wherein the recess is substantially parallel to the rail and the rail is substantially orthogonal to the first support, so that the rail slides substantially orthogonally to the first support and wherein the recess extends adjacent a surface of the rail and the detent extends from said surface.

4. The system of claim 2, wherein the plurality of detents extend from a surface of the rail.

5. The system of claim 1, having a plurality of detents on the second mounting potion of the rail and a corresponding plurality of apertures defined in said second support.

6. The system of claim 1, wherein the at least one aperture comprises a first portion and a second portion, the first portion being sized to receive the detent along an axis of the detent and the second portion being sized preventing removal of the detent along the axis of the detent.

7. A support assembly for a computer component, comprising:
   a rail having a surface and at least one recess extending along the surface;
   a support adjacent the rail;
   a detent extending from said rail or said support and engaged with at least one aperture defined in one of said rail or said support wherein the at least one aperture in the rail or the support is in a portion of the rail or the support receiving the detent; and
   an extension coupled to the support, the extension having a width greater than a width of the at least one recess and a portion moveable with respect to the support between a first position preventing sliding of the rail with respect to the support and a second position permitting sliding of the rail with respect to the support.

8. The support assembly of claim 7, wherein the rail has at least one detent formed on the surface of the rail.

9. The support assembly of claim 7, wherein the support has at least one other extension extending into the at least one recess of said rail.

10. The system of claim 7, wherein the at least one recess is oriented along a plane and the extension is positioned in the plane of the at least one recess when the extension is in the first position.

11. A support assembly for a computer component, comprising:
   a rail having
       a surface and
       at least one recess extending alone the surface and oriented along a plane;
   a support adjacent the rail;
   a detent extending from said rail or said support and engaged with at least one aperture defined in one of said rail or said support wherein the at least one aperture in the rail or the support is in a portion of the rail or the support receiving the detent; and
   an extension coupled to the support, the extension having a portion moveable with respect to the support between a first position preventing sliding of the rail with respect to the support and a second position permitting sliding of the rail with respect to the support,
   wherein the extension is positioned in the plane of the at least one recess when the extension is in the first position and the extension is away from the plane of the recess when the extension is in the second position.

12. The system of claim 11, further comprising a plurality of detents extending from said rail or said support engaged with respective ones of apertures defined in the other of said rail or said support.

13. A method of mounting a rail in a frame of a computer system, the method comprising the steps of:
   positioning a longitudinal axis of the rail adjacent and orthogonal to respective longitudinal axes of first and second supports;
   engaging a recess in a first mounting portion of the rail with a first extension on the first support, thereby permitting sliding movement of the rail with respect to the first support;
   engaging a detent on a second mounting portion of the rail with an aperture formed in the second support, thereby limiting the sliding movement of the rail with respect to the second support; and
   moving a second extension coupled to the first or second support to a position substantially preventing sliding movement of the rail.

14. The method of claim 13, further comprising the step of sliding the rail between first and second positions with respect to the first and second supports.

15. The method of claim 13, wherein the step of engaging the detent comprises the steps of inserting the detent into a first portion of the aperture and sliding the detent from the first portion into a second portion of the aperture.

* * * * *